(12) United States Patent
Oh

(10) Patent No.: US 6,229,755 B1
(45) Date of Patent: May 8, 2001

(54) WORDLINE DRIVING APPARATUS IN SEMICONDUCTOR MEMORY DEVICES

(75) Inventor: Young Nam Oh, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/475,019

(22) Filed: Dec. 30, 1999

(30) Foreign Application Priority Data

Dec. 30, 1998 (KR) .................................................. 98-61919

(51) Int. Cl.[7] ............................................................ G11C 7/00

(52) U.S. Cl. .................................. 365/230.06; 365/185.1; 365/185.01

(58) Field of Search ............................. 365/185.01, 185.1, 365/189.01, 230.03

(56) References Cited

U.S. PATENT DOCUMENTS 4,908,798 * 3/1990 Urai ................................. 365/230.03

* cited by examiner

Primary Examiner—Terrell W. Fears
(74) Attorney, Agent, or Firm—Jacobson, Price, Holman & Stern, PLLC

(57) ABSTRACT

The present invention is directed to a wordline driving apparatus in semiconductor memory devices. The wordline driving apparatus comprises a CMOS distributed type sub-wordline driver for receiving an output signal of a row decoder through a main wordline having a wiring structure of a single output line and controlling enabling of the sub-wordline in accordance with the received output signal and a sub pull-down driver for receiving the inverted signals of boosting signals through a control signal supplying wiring and performing a sub pull-down function with respect to the voltage level of the sub-wordline. According to the present invention, it is possible to greatly improve an access time with enhancing a high voltage transfer efficiency and preventing a delay of signal.

14 Claims, 3 Drawing Sheets

WORDLINE DRIVING APPARATUS IN SEMICONDUCTOR MEMORY DEVICES

BACKGROUND OF THE INVENTION

1. Field of the Invention

The present invention relates to a wordline driving apparatus in semiconductor memory devices, and more particularly to a wordline driving apparatus capable of preventing a delay of signal at an output line by using an output line of a single metal wiring structure and improving a transfer efficiency of a high voltage for driving a sub-wordline by using a sub-wordline driver of a CMOS distributed configuration.

2. Description of the Conventional Art

FIG. 1 shows a partial circuit diagram of a wordline driving apparatus according to a conventional art. The circuit comprises a decoding unit 100 for decoding address signals applied thereto and a sub-wordline driving unit 200 for controlling enabling of a sub-wordline in response to output signal from the decoding unit 100.

The decoding unit 100 includes a first PMOS transistor MP1 connected between a power supply voltage Vcc applying terminal and a node N1 and having its gate terminal to which a precharge control signal /xp is applied; a plurality of NMOS transistors MN1~MN3 connected in series between the node N1 and a ground terminal and having their respective gate terminals to which row address signals ax23, ax45 and, ax67 are applied respectively; a first inverter (I1) for inverting the voltage level at the node N1 and outputting it as a pull-up control signal pu; a second PMOS transistor MP2 having its gate terminal to which the output signal of the first inverter I1 is applied in a feedback manner and being interconnected in parallel with the first PMOS transistor MP1 between the power supply voltage Vcc applying terminal and the node N1; and a second inverter I2 for inverting the output signal of the first inverter I1 and outputting it as a pull-down control signal pd.

Also, the sub-wordline driving unit 200 includes a NMOS transistor MN5, which functions as a pull-up driver, connected between a boosting signal pxi applying terminal and a sub-wordline SWL and having its gate terminal to which the pull-up control signal pu is applied via a NMOS transistor MN4 having its gate terminal to which a power supply voltage Vcc is applied, and a NMOS transistor MN6, which functions as a pull-down driver, connected between the sub-wordline SWL and a ground terminal and having its gate terminal to which the pull-down control signal pd is applied.

Now, an operation of the wordline driving apparatus in accordance with the conventional art configured as described above will be explained briefly.

First, upon receiving a low level precharge signal /xdp, the first PMOS transistor MP1 is turned-on and the voltage level at the node N1 is transitted to a high level which is equal to the level of the power supply voltage Vcc.

Then, the high level signal at the node N1 is inverted by the first inverter I1 which in turn outputs a low level pull-up control signal pu for operating the sub-wordline driving unit 200.

Also, a high level pull-down control signal pd is outputted through the second inverter I2.

Meanwhile, the output signal of the inverter I1, that is, the pull-up control signal pu is applied to the gate of the second PMOS transistor MP2 which in turn turns-off, thereby allowing the voltage level at the node N1 to be rapidly precharged to a high level when precharging.

Thereafter, the pull-up control signal pu and pull-down control signal pd are inputted to the sub-wordline driving unit 200. More specifically, the pull-up control signal pu is inputted through the fourth NMOS transistor MN4, which was turned-on by the power supply voltage Vcc, to the gate of the fifth NMOS transistor MN5, and the pull-down control signal pd is inputted to the gate of the sixth NMOS transistor MN6. As a result, the fifth NMOS transistor MN5 is turned-off and the sixth NMOS transistor MN6 is turned-on, thereby allowing the sub-wordline connected to the gate of the pass transistor to have a low voltage level which is equal to the ground voltage level Vss.

Thereafter, if externally applied address signals ax23, ax45 and, ax67 are inputted through address pins on a chip, the voltage level at the node N1 is transitted to a low level.

That is, high level address signals ax23, ax45 and, ax67 for selecting the corresponded cell are applied and thus the first to third NMOS transistors coupled in series are turned-on so that the voltage level at the node N1 is transitted from a high level to a low level.

Meanwhile, since the precharge signal /xdp is disabled from a low level to a high level after initially precharging, at this time, the first PMOS transistor MP1 is in a turn-off state.

Thereafter, the voltage level at the node N1 is inverted by the first inverter I1, thereby allowing the pull-up control signal pu to be changed to a high level and the pull-down control signal pd to be changed to a low level.

Meanwhile, since the high level pull-up control signal pu is inputted to the gate of the second PMOS transistor MP2, the second PMOS transistor MP2 is turned-off and thus a power supply voltage Vcc is not supplied to the node N1 any longer.

Then, the pull-up control signal pu and pull-down control signal pd, which are output signals of the decoding unit 100, are inputted to the sub-wordline driving unit 200 thereby allowing the fifth NMOS transistor MN5 to be turned-on and the sixth NMOS transistor MN6 to be turned-off. Accordingly, a high voltage of a boosting signal level is outputted to the sub-wordline.

As a result, data stored in the cell corresponding to a designated address are outputted through the turned-on pass transistor and then via bit lines BL, /BL and data bus lines DB, /DB to the outside during a read operation, and are stored on a data storage node through the pass transistor during a writing operation.

As mentioned above, when driving a word line, disadvantages of a conventional art are as follows.

First, there may greatly occur a delay of signal in the output line since the decoding unit output line made of a metal wire is consisted of two (pu signal output terminal and pd signal output terminal) so that the interval between the metal wires becomes limited and thus the width thereof becomes narrow.

Second, due to a voltage drop occurred by using the NMOS transistor MN5 as a pull-up driver of the sub-wordline driving unit 200, the sub-wordline driving high voltage pxi cannot sufficiently be transferred to, when enabling, the sub-wordline.

That is, since there occurs a voltage drop as much as a threshold voltage Vt of the fifth NMOS transistor MN5 with respect to the sub-wordline driving high voltage pxi applied to the drain terminal thereof, the sub-wordline is on only a voltage level of the driving high voltage pxi minus the threshold voltage Vt, and thus the wordline is driven by the voltage level.

Consequently, it causes a turned-off width of the pass transistor to be narrow, resulting in insufficient restore of data in memory devices requiring a cell refresh such as a DRAM.

SUMMARY OF THE INVENTION

Accordingly, the present invention has been made in view of the above problems and it is an object of the present invention is to provide a wordline driving apparatus capable of preventing a delay of signal of a main wordline output signal by using a single metal wiring and improving the transfer efficiency of a sub-wordline driving high voltage by using a CMOS type transistor.

In order to achieve the above objects, a wordline driving apparatus according to the preferred embodiment of the present invention comprises a decoding unit arranged on one side end of a semiconductor memory cell array, for decoding a plurality of externally inputted address signals in order to generate a main wordline output signal, with the main wordline output signal being outputted through a single metal wireing; and a sub-wordline driving unit arranged on each of the cells in a CMOS distributed configuration, for controlling a plurality of sub-wordlines in accordance with the main wordline output signal.

The decoding unit comprises a PMOS transistor having its gate terminal to which a precharge signal is applied and being connected between a high voltage applying terminal and a first node; NMOS transistors being connected in series between the first node and a ground terminal and having their respective gate terminals to which row address combination signals are applied, respectively; a first inverter inverting the voltage level at the first node and transferring the inverted voltage level to a second node; a PMOS transistor having its gate terminal to which the voltage level of the second node is feedback and being connected in parallel to the PMOS transistor; and a second inverter inverting the voltage level at the second node and generating a main wordline output signal.

In addition, the sub-wordline driving unit comprises pull-up drivers being connected between respective boosting signals applying terminals and respective sub-wordlines and being turned-on selectively in accordance with the main wordline output signal; and first and second wordline driving units including first and second pull-down driver units being connected between the respective sub-wordlines and a ground terminal and being turned-on selectively in accordance with the main wordline output signal and the inverted signals of the boosting signals and wherein the first and second wordline driving units control the respective sub-wordlines using different predetermined decoded high voltage and low voltage.

The pull-up driver and pull-down driver are a PMOS transistor and a NMOS transistor, respectively.

BRIEF DESCRIPTION OF THE DRAWINGS

The above and other objects, features and advantages in accordance with the present invention will be apparent from the following detailed description with reference to the accompanying drawings, wherein.

DETAILED DESCRIPTION OF THE PREFERRED EMBODIMENT

Now, the configuration and operation of a wordline driving apparatus in accordance with the present invention will be described in detail with reference to the accompanying drawings.

Figure 1:
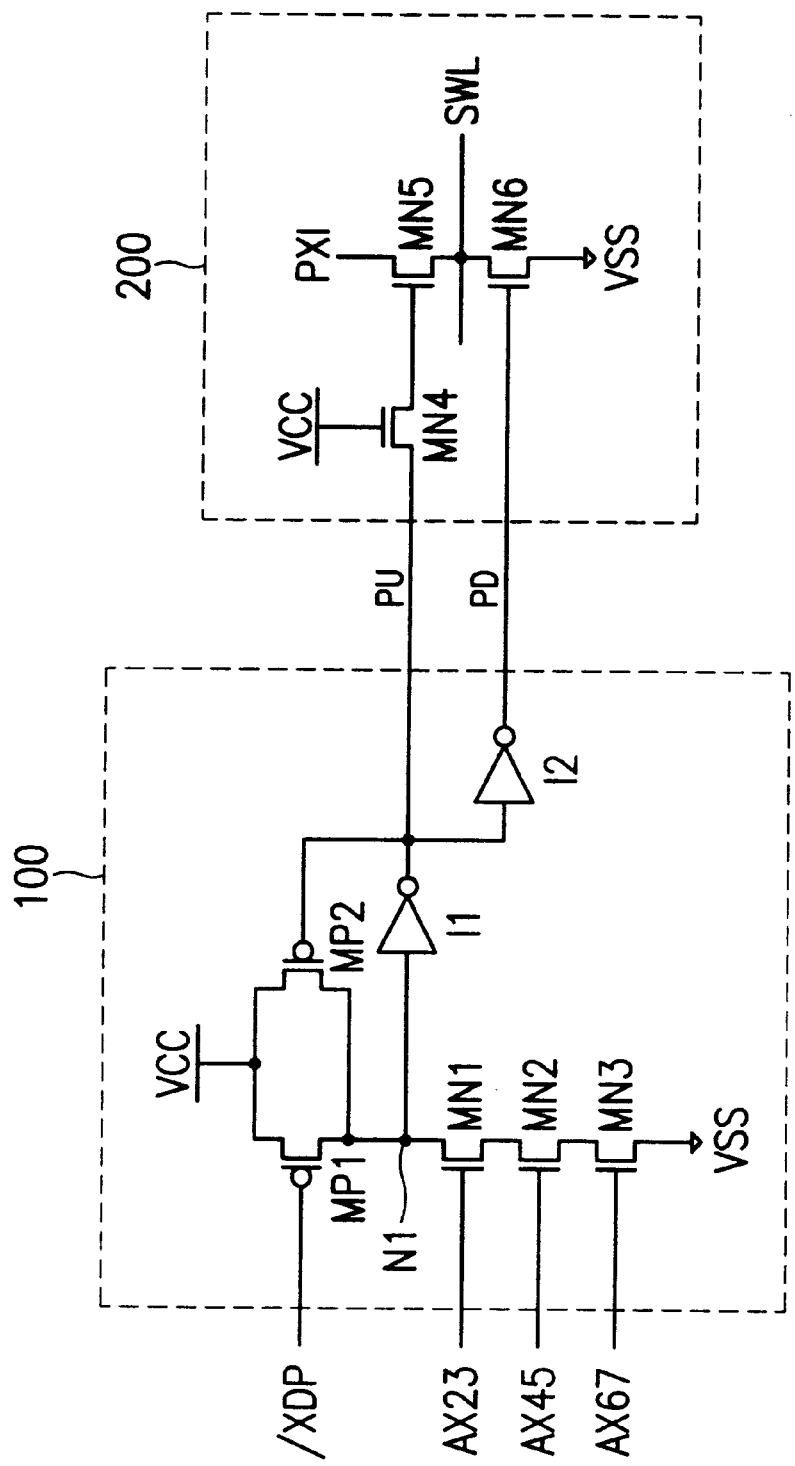
FIG. 1 shows a circuit diagram of a wordline driving apparatus in accordance with a conventional art.
Figure 2:
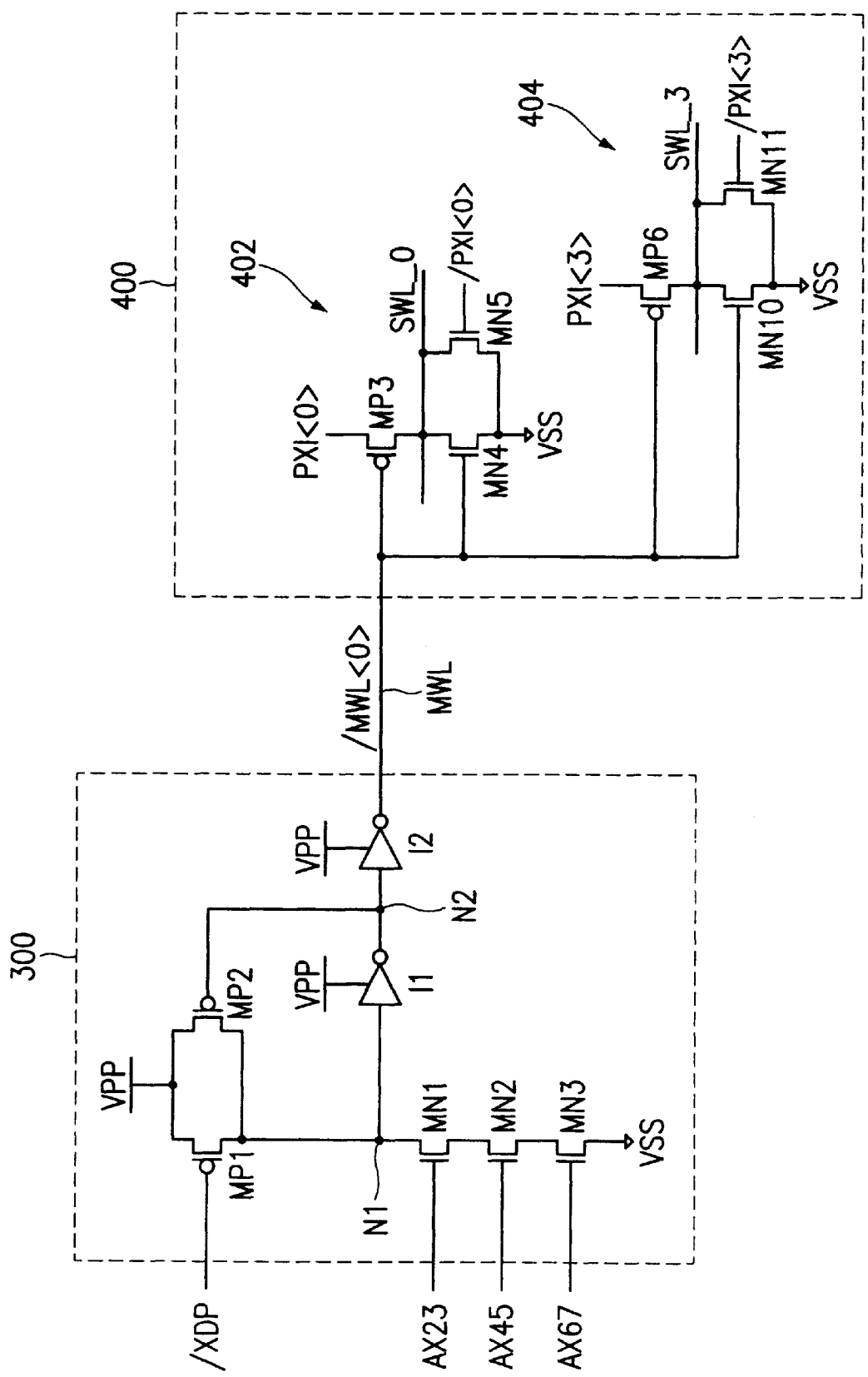
FIG. 2 shows a circuit diagram illustrating a decoding unit and a sub-wordline driving unit in a word line driving unit in accordance with one preferred embodiment of the present invention.

FIG. 2 shows a circuit diagram illustrating a decoding unit and a sub-wordline driving unit in a wordline driving apparatus in accordance with a preferred embodiment of the present invention. As shown in FIG. 2, the wordline driving apparatus comprises a decoding unit 300 having a single output line wiring structure and generating a main wordline output signal /mwl<0> by decoding externally inputted address signals ax23, ax45 and, ax67 and a sub-wordline driving unit 400 arranged distributedly on each of the cell blocks as CMOS configuration and controlling enabling of a plurality of sub-wordlines in accordance with the main wordline output signal.

The decoding unit 300 comprises a PMOS transistor MP1 having its gate terminal to which a precharge signal /xdp is applied and being connected between a high voltage Vpp applying terminal and a first node N1; NMOS transistors MN1~MN3 being connected in series between the first node N1 and a ground terminal Vss and having their respective gate terminals to which row address combination signals ax23, ax45 and, ax78 are applied, respectively; a first inverter I1 inverting the voltage level at the first node N1 and transferring the inverted voltage level to a second node N2; a PMOS transistor MP2 having its gate terminal to which the voltage level at the second node N2 is feedback and being connected in parallel to the PMOS transistor MP1; and a second inverter I2 inverting the voltage level at the second node N2 and generating a main wordline output signal /mwl<0>.

In addition, the sub-wordline driving unit 400 which is comprised of a first wordline driving unit 402 and a second wordline driving unit 404 comprises PMOS transistors MP3~MP6, which are provided as pull-up drivers, being connected between respective boosting signals pxi<0>~pxi<3> applying terminals and respective sub-wordlines SWL_0~SWL_3 and being turned-on selectively in accordance with the main wordline output signal /mwl<0>; and a plurality of NMOS transistors MN4~MN11, which are provided first and second pull-down drivers, being connected between the respective sub-wordlines SWL_0~SWL_3 and a ground terminal and being turned on selectively in accordance with the main wordline output signal /mwl<0> and the inverted signals /pxi<0>~/pxi<3> of the boosting signals.

Figure 3:
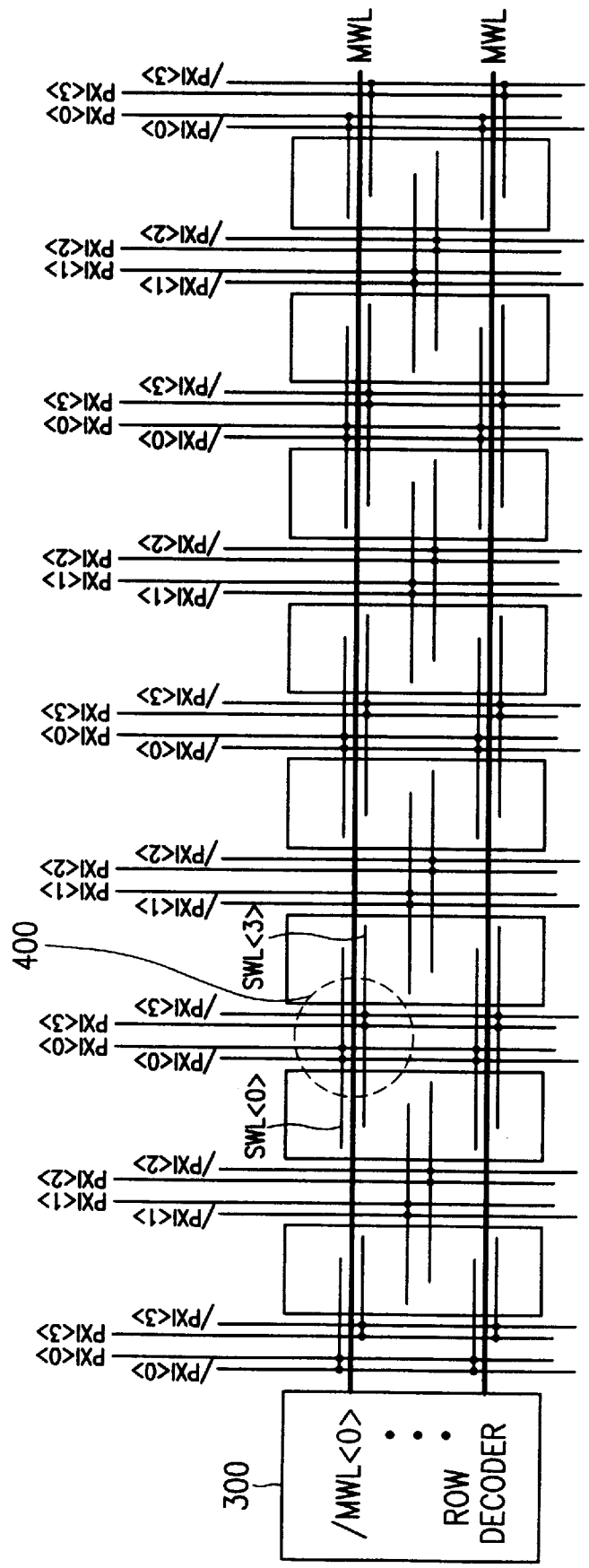
FIG. 3 is a view schematically illustrating a wire configuration of the wordline driving apparatus of FIG. 2.

FIG. 3 is a view schematically illustrating circuit arrangements of the wordline driving apparatus as shown in FIG. 2. As shown, the wordline driving apparatus comprises a plurality of main wordlines MWL of a single metal wiring which are arranged to be connected to the decoding unit 300; boosting signals supplying wirings for supplying boosting signals pxi<0>~pxi<3> which are applied to a source terminal of a pull-up driver in the sub-wordlines driving units 400 which are arranged distributedly on each of the cell blocks as a CMOS configuration; a control signal supplying wiring which receives the inverted signals /pxi<0>~/pxi<3> of the boosting signals and transfer them to sub pull-down drivers in the sub-wordline driving unit 400.

Now, the operation of the wordline driving apparatus having above described configuration and wiring structure in accordance with the present invention will be described in detail.

First, upon receiving a low level precharge signal /xdp, the PMOS transistor MP1 is turned-on and thus the node N1 is on a high level potential which is equal to the power supply Vcc level.

Then, the high voltage level at the first node N1 is inverted by the first inverter I1 and thus the second node N2 is on a low voltage level.

Also, the low voltage level at the second node N2 is inverted by the second inverter I2 which in turn generates a high voltage level of the main wordline output signal /mwl<0>.

Meanwhile, the low voltage level at the second node N2 is applied to the gate of the PMOS transistor MP2 so as to allow it to be turned-on, and thus the voltage level at the first node N1 is quickly precharged to high level when precharging.

Thereafter, the main wordline output signal /mwl<0> is inputted to the sub-wordline driving unit 400 behind, allowing the PMOS transistors MP3~MP6 to be turned-off and the NMOS transistors MN4~MN11 to be turned-on, resulting in a disabling state of the sub wordlines SWL_0~SWL_3.

Then, when receiving externally applied address signals ax23, ax45 and, ax65, the voltage level at the first node N1 is transitted to a low level. That is, if address signals ax23,ax24 and, ax67, having a high voltage level are applied, the NMOS transistors connected in series are turned-on and thus the voltage level at the first node N1 is transitted from a high level to a low level.

The high voltage level at the second node N2 is inverted by the second inverter I2 which in turn generates the main wordline output signal /mwl<0> having a low voltage level. The output signal /mwl<0> is applied to the gate of the PMOS transistor MP2, allowing the PMOS transistor MP2 to be turned-off. As a result, no power supply voltage Vcc is transferred to the first node N1.

Thereafter, the main wordline output signal /mwl<0> is inputted to the wordline driving unit 400 having a CMOS configuration, allowing the PMOS transistors MP3~MP6 to be turned-on and at the same time the NMOS transistors MN4~MN11 to be turned-off.

As a result, the high voltage level of the boosting signals pxi<0>~pxi<3>, which are the sub-wordline driving high voltages, are transferred through the PMOS transistors MP3~MP6 to each of the sub-wordlines SWL_0~SWL_3 without any voltage loss, thereby enabling the sub-wordlines simultaneously.

As described above, the wordline driving apparatus according to the present invention has excellent effects capable of improving a high voltage transfer efficiency using a CMOS configuration. Also, by arranging an output line of a single metal wiring, it is possible to prevent a signal delay and thereby to improve largely an access time.

Although the preferred embodiments of the present invention have been disclosed for illustrative purposes, those skilled in the art will appreciate that various modifications, additions and substitutions are possible, without departing from the scope and spirit of the invention as disclosed in the appended claims.

What is claimed is:

1. A wordline driving apparatus comprising:
    a decoding means for decoding a plurality of externally inputted address signals and generating a main wordline output signal, said main wordline output signal being outputted through a single metal wiring; and
    a sub-wordline driving means having a CMOS configuration, for controlling a plurality of sub-wordlines in accordance with said main wordline output signal.

2. The wordline driving apparatus according to claim 1, wherein said decoding means comprises:
    a first PMOS transistor having a gate terminal to which a precharge signal is applied and being connected between a high voltage applying terminal and a first node;
    a plurality of NMOS transistors being connected in series between the first node and a ground terminal, each of said plurality of NMOS transistors having a separate gate terminal to which row address signals are applied, respectively;
    a first inverter for inverting the voltage level at the first node and transferring the inverted voltage level to a second node;
    a second PMOS transistor having a gate terminal to which the voltage level of the second node is feedback and being connected in parallel to the first PMOS transistor; and
    a second inverter for inverting the voltage level at the second node and generating a main wordline output signal.

3. The wordline driving apparatus according to claim 1, wherein said sub-wordline driving means comprises:
    pull-up drivers being connected between respective boosting signal applying terminals and respective sub-wordlines and being turned-on selectively in accordance with said main wordline output signal; and
    first and second wordline driving means including first and second pull-down driver portions being connected between the respective sub-wordlines and a ground terminal and being turned-on selectively in accordance with the main wordline output signal and the inverted signals of the boosting signals and wherein the first and second wordline driving portions control the respective sub-wordlines using different predetermined decoded high voltage and low voltage.

4. The wordline driving apparatus according to claim 3, wherein said pull-up driver and pull-down driver are a PMOS transistor and a NMOS transistor, respectively.

5. The wordline driving apparatus according to claim 1, wherein said sub-wordline driving means includes a plurality of sub-wordline driving units, each separately controlling a sub-wordline assigned thereto in accordance with an assigned boosting signal, an inverted signal of the assigned boosting signal and the main wordline output signal, each sub-wordline driving unit comprising:
    a pull-up driver, being connected between a terminal applying the assigned boosting signal and the assigned sub-wordline, for being turned-on selectively in accordance with the main wordline output;
    a first pull-down driver, being connected between a ground terminal and the assigned sub-wordline, for being turned-on selectively in accordance with the main wordline output; and
    a second pull-down driver, being connected between the ground terminal and the assigned sub-wordline, for being turned-on selectively in accordance with a terminal applying an inverted signal of the assigned boosting signal.

6. The wordline driving apparatus according to claim 5, wherein the pull-up driver is a PMOS transistor, and each of the first and second pull-down drivers is a NMOS transistor.

7. A wordline driving apparatus comprising:
    a decoding means for decoding a plurality of externally inputted address signals and generating a main wordline output signal, said main wordline output signal being outputted through a single metal wiring; and a plurality of sub-wordline driving units, each separately controlling a sub-wordline assigned thereto in accordance with an assigned boosting signal, an inverted signal of the assigned boosting signal and the main wordline output signal.

8. The wordline driving apparatus according to claim 7, wherein said decoding means comprises:

a first PMOS transistor having a gate terminal to which a precharge signal is applied and being connected between a high voltage applying terminal and a first node;

a plurality of NMOS transistors connected in series between the first node and a ground terminal, each of said plurality of NMOS transistors having a separate gate terminal to which row address signals are applied, respectively;

a first inverter for inverting the voltage level at the first node and transferring the inverted voltage level to a second node;

a second PMOS transistor having a gate terminal to which the voltage level of the second node is feedback and being connected in parallel to the first PMOS transistor; and a second inverter for inverting the voltage level at the second node and generating a main wordline output signal.

9. The wordline driving apparatus according to claim 7, wherein each sub-wordline driving unit comprises:

a pull-up driver, connected between a terminal applying the assigned boosting signal and the assigned sub-wordline, for being turned-on selectively in accordance with the main wordline output;

a first pull-down driver, connected between a ground terminal and the assigned sub-wordline, for being turned-on selectively in accordance with the main wordline output; and a second pull-down driver, connected between the ground terminal and the assigned sub-wordline, for being turned-on selectively in accordance with a terminal applying an inverted signal of the assigned boosting signal.

10. The wordline driving apparatus according to claim 9, wherein the pull-up driver is a PMOS transistor, and each of the first and second pull-down drivers is a NMOS transistor.

11. The wordline driving apparatus according to claim 8, wherein each sub-wordline driving unit comprises:

a pull-up driver, connected between a terminal applying the assigned boosting signal and the assigned sub-wordline, for being turned-on selectively in accordance with the main wordline output;

a first pull-down driver, connected between a ground terminal and the assigned sub-wordline, for being turned-on selectively in accordance with the main wordline output; and a second pull-down driver, connected between the ground terminal and the assigned sub-wordline, for being turned-on selectively in accordance with a terminal applying an inverted signal of the assigned boosting signal.

12. The wordline driving apparatus according to claim 11, wherein the pull-up driver is a PMOS transistor, and each of the first and second pull-down drivers is a NMOS transistor.

13. The wordline driving apparatus according to claim 2, wherein said plurality of NMOS transistors includes three NMOS transistors.

14. The wordline driving apparatus according to claim 8, wherein said plurality of NMOS transistors includes three NMOS transistors.

* * * * *